United States Patent [19]
Kim

[11] Patent Number: 5,866,921
[45] Date of Patent: Feb. 2, 1999

[54] LATERAL SRAM TRANSISTOR CIRCUITS AND METHODS OF FABRICATION THEREFOR

[75] Inventor: Gyu-cheol Kim, Seoul, Rep. of Korea

[73] Assignee: Samsung Electronics Co., Ltd., Suwon, Rep. of Korea

[21] Appl. No.: 26,635

[22] Filed: Feb. 20, 1998

Related U.S. Application Data

[63] Continuation of Ser. No. 670,214, Jun. 21, 1996.

[30] Foreign Application Priority Data

Jun. 23, 1995 [KR] Rep. of Korea .................... 95-17154

[51] Int. Cl.$^6$ .......................... H01L 29/78; H01L 29/04; H01L 27/11
[52] U.S. Cl. ............................... 257/67; 257/69; 257/903
[58] Field of Search ................................ 257/670, 214, 257/67, 69, 903

[56] References Cited

U.S. PATENT DOCUMENTS

| | | | |
|---|---|---|---|
| 4,554,572 | 11/1985 | Chatterjee | 257/69 |
| 4,980,732 | 12/1990 | Okazawa | 257/903 |
| 5,173,754 | 12/1992 | Manning | 257/903 |
| 5,214,295 | 5/1993 | Manning | 257/67 |
| 5,324,860 | 6/1994 | Pfiester et al. | 257/903 |
| 5,640,023 | 6/1997 | Balasinski et al. | 257/69 |

*Primary Examiner*—Gene M. Munson
*Attorney, Agent, or Firm*—Myers Bigel Sibley & Sajovec

[57] ABSTRACT

A substrate transistor is formed, including a gate insulation region formed on a substrate, spaced apart source/drain regions formed in the substrate, and a gate electrode formed on the gate insulation region, disposed between the spaced apart source/drain regions, the gate electrode having a sidewall portion. A lateral thin film transistor is formed, including a sidewall gate insulation region on the sidewall portion of the gate electrode and a lateral channel region on the sidewall gate insulation region such that the gate electrode controls the current in the lateral channel region. A first one of the spaced apart source/drain regions of the substrate transistor preferably includes a lightly-doped inner portion disposed adjacent the gate electrode and a heavily-doped outer portion disposed adjacent the lightly-outer portion, opposite the gate electrode. The lateral channel region preferably is electrically connected to a second one of the spaced-apart source/drain regions of the substrate transistor. The sidewall gate insulation region contacts the lateral channel region at a first surface of the lateral channel region, and an auxiliary gate may be formed on a second surface of the lateral channel region, the auxiliary gate including an auxiliary gate insulation region on the lateral channel region and an auxiliary gate electrode on the auxiliary gate insulation region. The auxiliary gate electrode preferably is formed on an insulation region formed on the substrate, extends from the insulation region to overlie portions of the lateral channel region.

11 Claims, 3 Drawing Sheets

LATERAL SRAM TRANSISTOR CIRCUITS AND METHODS OF FABRICATION THEREFOR

This application is a continuation of Ser. No. 08/670,214 filed Jun. 21, 1996.

FIELD OF THE INVENTION

The present invention relates to integrated circuits and methods of fabrication therefor, in particular, to static random access memory (SRAM) circuits and methods of fabrication therefor.

BACKGROUND OF THE INVENTION

Static random access memory (SRAM) devices are used in a wide variety of memory applications, frequently in applications where high speed performance is important. As is well-known to those skilled in the art, traditional SRAM circuits typically include a bistable transistor cell which includes a pair of cross-coupled transistors which switch current from a power supply voltage through fixed resistor loads. However, the use of fixed resistors can limit the switching speed of the cell due to the time constant associated with the fixed resistors. Increasing the speed at which such an SRAM cell is accessed can lead to an increased number of "soft errors", i.e., misreadings of the SRAM cell.

To avoid such problems, SRAM cells have been developed which use a cross-coupled complementary transistor circuit such as that illustrated in FIG. 1, which includes a pair of driving transistors 2, 4 which drive a pair of complementary load transistors 10, 12. Because the load transistors 10, 12 present a small resistance when biased in an "on" state, switching times may be reduced without undesirably increasing the probability of soft errors. In addition, the complementary cell of FIG. 1 tends to be more stable and less vulnerable to soft errors under a low standby current and voltage.

The driving transistors 2, 4 typically are fabricated as substrate transistors. For example, as illustrated in FIG. 2, a driving transistor may be a field effect transistor having source/drain regions 23, 25 formed in a substrate 21 on opposite sides of a channel region 27, with a gate electrode 29 formed on the surface of the substrate, controlling current flowing between the source and drain regions. The load transistors 10, 12 typically are fabricated as thin film transistors, for example, source/drain and channel regions 35, 33 formed from a semiconductor layer formed on a gate electrode 31.

Although the cell illustrated in FIG. 2 is formed from a small number of polycrystalline silicon layers, it has a relatively complex structure. As the size of the cell is decreased, fabrication, in particular, the interconnection of the gate electrodes 31, 29, may become more difficult. The increased difficulty in fabricating such a complex cell structure as its size is reduced can lead to poor yields and increased production costs.

SUMMARY OF THE INVENTION

In light of the foregoing, it is an object of the present invention to provide improved static random access memory (SRAM) cells and methods of fabrication therefor.

It is another object of the present invention to provide SRAM cells having a less complex load transistor structure, and to provide methods of fabrication therefor.

It is another aspect of the present invention to provide SRAM cells capable of greater integration density than cells using conventional thin film load transistors, and to provide methods of fabrication therefor.

These and other objects, features and advantages are provided according to the present invention by SRAM cells in which thin film load transistors include a sidewall gate insulation region formed on a sidewall portion of a controlling electrode of a substrate transistor and a lateral channel region formed on the sidewall gate insulation region such that the controlling electrode controls current in the lateral channel region. The thin film load transistor may include an auxiliary gate including an auxiliary gate insulation region formed on the lateral channel region and an auxiliary gate electrode formed on the auxiliary gate insulation region.

By forming a thin film load transistor lateral to the controlling electrode, a lateral thin film load transistor may be obtained having a compact structure compared to conventional thin-film designs. This compact structure can be reliably produced in a more efficient manner. An auxiliary gate can be included to improve the performance of the lateral thin film load transistor by increasing current in the lateral channel region for a given gate bias.

In particular, according to the present invention, an SRAM cell includes a substrate transistor including a gate insulation region on a substrate, spaced apart source/drain regions in the substrate, and a gate electrode on the gate insulation region, disposed between the spaced apart source/drain regions, the gate electrode having a sidewall portion. The SRAM cell also includes a lateral thin film load transistor including a sidewall gate insulation region on the sidewall portion of the gate electrode and a lateral channel region on the sidewall gate insulation region such that the gate electrode controls the current in the lateral channel region.

Preferably, the substrate has first conductivity type, the spaced apart source/drain regions have second conductivity type, and the lateral channel region has first conductivity type. More preferably, the spaced apart source/drain regions are n-type silicon and the lateral channel region includes at least one of polycrystalline silicon and amorphous silicon. A first one of the spaced apart source/drain regions of the substrate transistor also preferably includes a lightly-doped inner portion disposed adjacent the gate electrode and a heavily-doped outer portion disposed adjacent the lightly-doped outer portion, opposite the gate electrode. The lateral channel region preferably is electrically connected to a second one of the spaced apart source/drain regions of the substrate transistor. A high cell ratio SRAM cell may thereby be provided.

According to another aspect of the invention, the sidewall gate insulation region contacts the lateral channel region at a first surface of the lateral channel region, and an auxiliary gate is formed on a second surface of the lateral channel region. The auxiliary gate includes an auxiliary gate insulation region on the second surface of the lateral channel region and an auxiliary gate electrode on the auxiliary gate insulation region. The auxiliary gate electrode preferably is formed on an insulation region formed on the substrate, and extends from the insulation region to overlie portions of the lateral channel region. The auxiliary gate electrode preferably includes at least one of doped polycrystalline silicon, silicide and metal.

According to another aspect of the present invention, a transistor circuit includes a first device including a controlling electrode on a substrate, the controlling electrode having a sidewall portion. The circuit also includes a lateral thin film transistor including a sidewall gate insulation region on the sidewall portion of the controlling electrode, and a lateral channel region on the sidewall gate insulation region such that the controlling electrode controls current in the lateral channel region. The lateral channel region contacts the sidewall gate insulation region at a first surface, and preferably includes an auxiliary gate including an auxiliary gate insulation region on a second surface of the lateral channel region and an auxiliary controlling electrode on the auxiliary insulation region. The auxiliary controlling electrode preferably is formed on an insulation region on the substrate, and extends from the insulation region to overlie portions of the lateral channel region.

According to method aspects of the present invention, a substrate transistor is formed including a gate insulation layer on a substrate, a gate electrode overlying the gate insulation region, and spaced apart source/drain regions in the substrate on opposite sides of the gate electrode. A lateral thin-film load transistor is then formed including a sidewall gate insulation region on a sidewall portion of the gate electrode and a lateral channel region on the sidewall gate insulation region.

The substrate transistor may be formed by forming a gate insulation layer on a substrate, forming a gate electrode on the gate insulation layer, and forming spaced apart source/drain regions in the substrate on opposite sides of the gate electrode. The spaced apart source/drain regions may be formed by implanting ions in the substrate using the gate electrode as a mask. Preferably, the substrate has first conductivity type, the spaced apart source/drain regions have second conductivity type, and the lateral channel region has first conductivity type. More preferably, the spaced apart source/drain regions are n-type silicon and the lateral channel region includes polycrystalline silicon, amorphous silicon, or a combination thereof.

To form the lateral thin-film load transistor, a sidewall gate insulation region is formed on a sidewall portion of the gate electrode, and a lateral channel region is formed on the sidewall gate insulation region. The sidewall gate insulation region may be formed by forming insulation regions on sidewall portions of the gate electrode and forming spacers on the insulation regions using conventional techniques. The spacers preferably are formed of polycrystalline silicon, amorphous silicon, or a combination thereof.

Ions may be implanted in an outer portion of one of the source/drain regions of the substrate transistor, leaving a lightly-doped inner portion of the one source/drain region disposed between the outer portion and the gate electrode. In addition, an auxiliary gate, including an auxiliary gate insulation region on the lateral channel region and an auxiliary gate electrode on the auxiliary gate insulation region, may be formed. The auxiliary gate electrode may include doped polycrystalline silicon, low resistance silicide, metal or a combination thereof. Simplified thin film transistor structures, and simplified methods of fabrication therefor, are thus provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
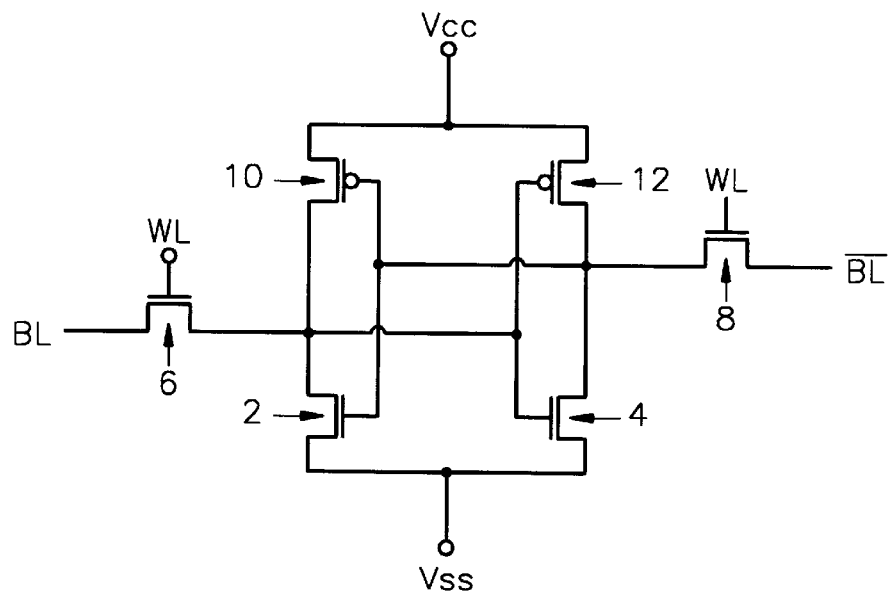
FIG. 1 is an equivalent circuit diagram of a static random access memory (SRAM) cell according to the prior art.
Figure 2:
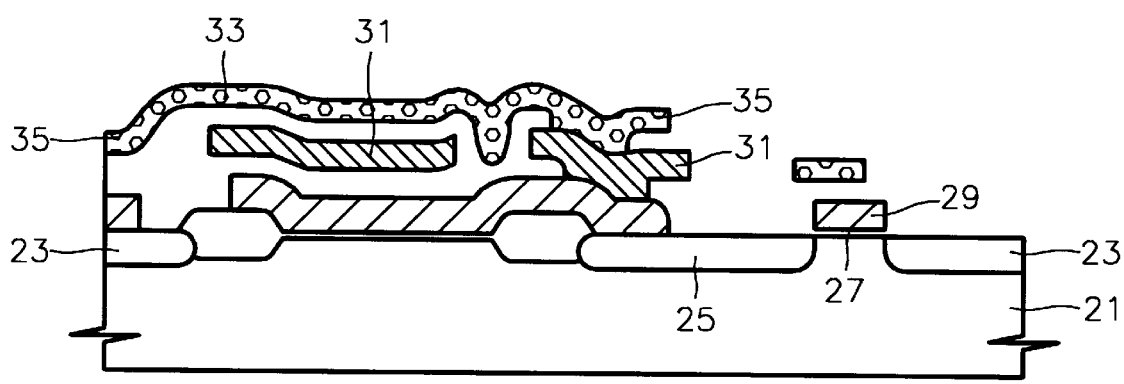
FIG. 2 is a cross-sectional view illustrating an SRAM cell having a thin film load transistor according to prior art.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 3:
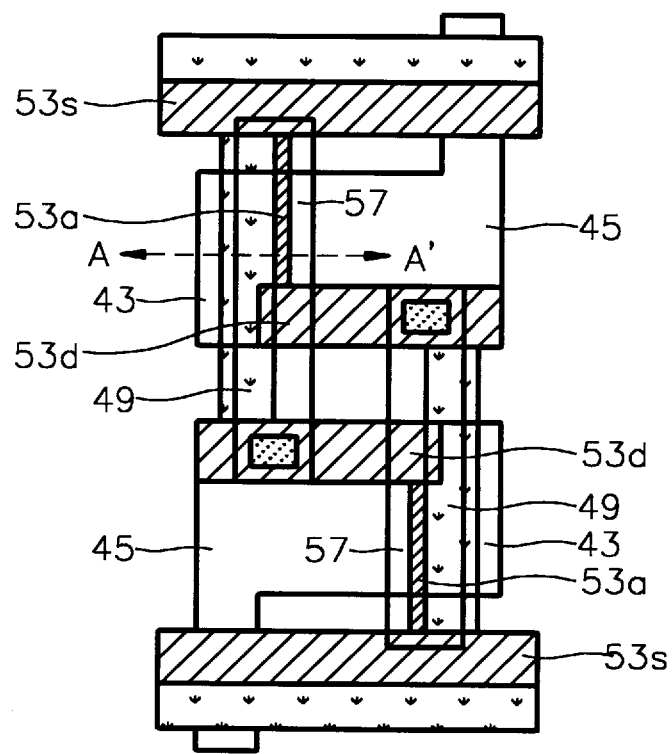
FIG. 3 is a plan view illustrating an SRAM cell according to the present invention.
Figure 4:
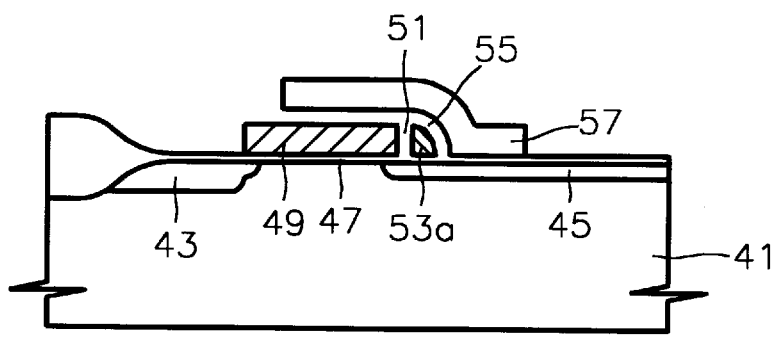
FIG. 4 is a cross-sectional view of an SRAM cell according to the present invention.

Referring to FIGS. 3 and 4, an SRAM cell according to the present invention includes a substrate transistor 40 formed on a substrate 41. The substrate transistor 40 includes a gate insulation region 47 on the substrate 41, spaced apart source/drains regions 43, 45 in the substrate 41, on opposite sides of a gate electrode 49 on the gate insulation layer 47. As illustrated, one of the source/drain regions 43 may include a lightly-doped inner portion 43a disposed adjacent the gate electrode 49 and a heavily-doped outer portion 43b disposed adjacent the lightly-doped outer portion 43a, opposite the gate electrode 49. As those skilled in the art will understand, because the source/drain region 43 includes a heavily-doped outer portion having an impurity concentration higher than that of the other source/drain region 45, the substrate transistor 40 can provide an increased cell ratio of the lateral thin film transistor 42 which it drives.

FIG. 4 also illustrates a lateral thin film load transistor 42 according to the present invention, including a sidewall gate insulation region 51 on a sidewall portion of the gate electrode 49 and a lateral channel region 53a on the sidewall gate insulation layer 51, such that the gate electrode 49 controls current in the lateral channel region 53a. As illustrated, an auxiliary gate may also be included in the lateral load transistor 42, including an auxiliary gate insulation region 55 on a surface of the lateral channel region 53a, apart from the surface where the lateral channel region contacts the sidewall gate insulation region 51, and an auxiliary gate electrode 57 on the auxiliary gate insulation region 55. The auxiliary gate electrode 57 preferably is formed on an insulation region 47a on the substrate 41, and may extend from the insulation region 47a to overlie portions of the lateral channel region 53a and the gate electrode 49. Those skilled in the art will appreciate that the lateral transistor structure illustrated in FIG. 4 is not limited to use as load transistor in an SRAM cell, and that a variety of transistors or other devices having a gate or other controlling electrode with sidewall portions on which gate structures may be formed, such as bipolar transistors, gate-controlled rectifiers and the like, may be used with the present invention.

Figure 5A:
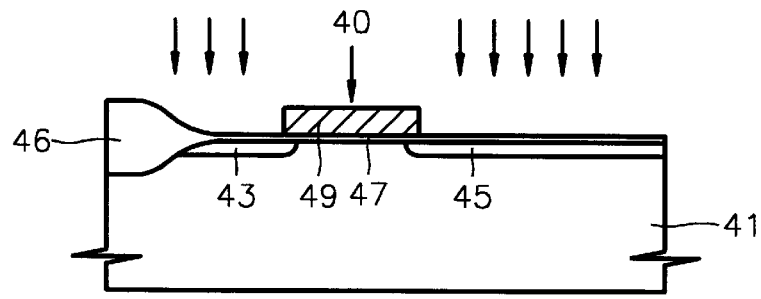
FIGS. 5A–5D are cross-sectional views of intermediate fabrication products illustrating steps for fabricating an SRAM cell according to the present invention.

FIGS. 5A–5D are cross-sectional views of intermediate fabrication products illustrating steps for manufacturing an SRAM with a lateral thin film load transistor according to the present invention. In particular, FIG. 5A illustrates steps for forming a substrate transistor 40 on a substrate 41, including spaced-apart source/drain regions 43, 45 and a gate electrode 49 on a gate insulation region 47. An isolation region for defining an active region is formed on the substrate 41, which preferably has first conductivity type. The isolation region may include a field oxide region 46 and a thinner gate insulation region 47 formed, for example, by thermal oxidation of the substrate 41. The gate electrode 49 is formed on the gate insulation region 47, for example, by forming a conductive layer on the gate insulation region 47 and patterning the conductive layer to form the gate electrode 49. The spaced apart source drain regions 43, 45 may then be formed by implanting ions, preferably of second conductivity type, into the substrate 41 using the gate electrode 49 as a mask, and thermally treating to form the spaced apart source/drain regions 43, 45.

Figure 5B:
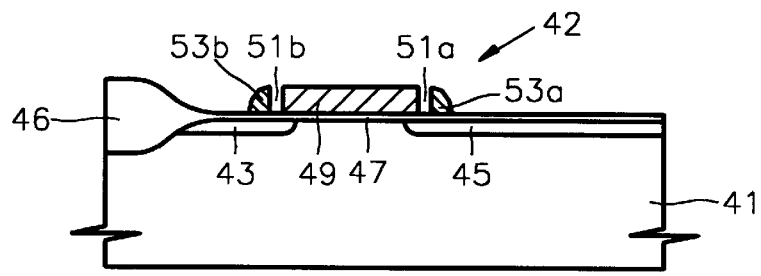

FIG. 5B illustrates steps for forming a lateral thin film load transistor 42 on a sidewall portion of the gate electrode 49, including a sidewall gate insulation region 51a and a lateral channel region 53a. An insulation layer may be formed on the substrate 41, covering sidewall portions of the gate electrode 49. A semiconductor layer, preferably polycrystalline silicon or amorphous silicon, may then be formed on the insulation layer. The semiconductor layer may then be etched according to well-known techniques to leave spacers 53a, 53b on the insulation regions 51a, 51b on the sidewalls of the gate electrode 49. Preferably, the spacers have second conductivity type, such that the thin film transistor formed therefrom may have a polarity complementary to that of the substrate transistor 40, to implement a complementary SRAM transistor circuit having an equivalent circuit similar to that of FIG. 1.

Source/drain regions 53s and 53d (FIG. 3) for the thin film transistor 42 may be formed in the channel region 53a, for example, by masking and ion implementation according to techniques well-known to those skilled in the art, and need not be further discussed herein. Prior to formation of the semiconductor layer, a contact hole may be formed in the insulation layer, leaving one of the source/drain regions 45 exposed such that the subsequently formed semiconductor layer may contact the exposed source/drain region 45 and thereby create an electrical connection between the channel region 53a and the source/drain region 45.

Figure 5C:
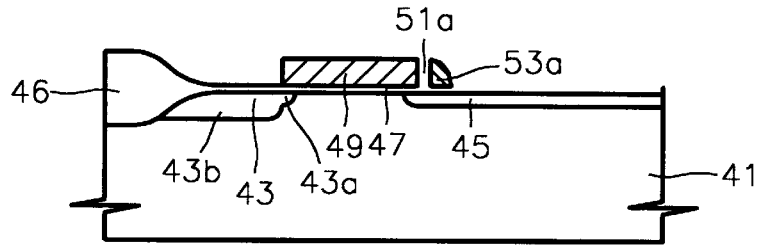

FIG. 5C illustrates steps for fabricating a source/drain region 43 having lightly-doped and heavily-doped portions 43a, 43b. The spacer 53b overlying one of the source/drain regions 43 of the substrate transistor 40 may be removed using convention photomasking and etching techniques. Ions, preferably having second conductivity type, may then be implanted, for example, using conventional photomask techniques, into the exposed source/drain region 43, thereby forming a heavily-doped outer portion 43b and leaving a lightly-doped inner portion 43a in the source/drain region 43.

Figure 5D:
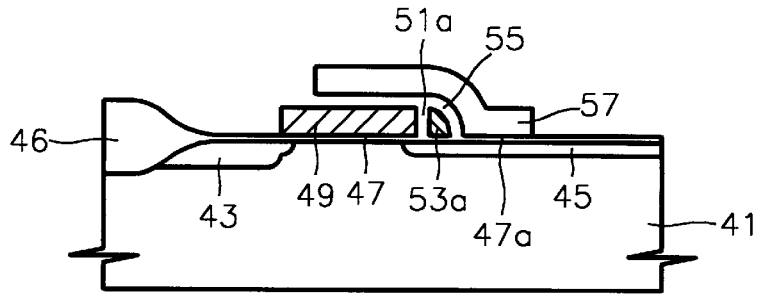

FIG. 5D illustrates steps for forming an auxiliary gate for the lateral channel region 53a. As those skilled in the art will appreciate, because the area of the sidewall gate structure formed at the surface where the sidewall gate insulation region 51a contacts the lateral channel region 53a is relatively small, the thin film transistor may not provide the desired "on" current. Accordingly, an auxiliary gate may be formed on a second surface of the lateral channel region 53a. In particular, an auxiliary insulation region 55 is formed on portions of the lateral channel region 53a, a conductive layer formed on the insulation layer, and the conductive layer patterned to form an auxiliary gate electrode 57. The auxiliary insulation region 55 preferably covers at least the lateral channel region 53a. The auxiliary gate electrode 57 preferably is formed on an insulation region 47a on the substrate 41, and may extend to overlie portions of the lateral channel region 53a and the gate electrode 49. Preferably, the auxiliary gate electrode 57 is electrically connected to the gate electrode 49, and may be formed from doped polycrystalline silicon, low-resistance silicide, metal or a combination thereof.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A static random access memory (SRAM) cell, comprising:

a substrate transistor including a gate insulation region on a substrate, spaced apart source/drain regions in said substrate, and a gate electrode on said gate insulation region, disposed between said spaced apart source/drain regions, said gate electrode having a top face, a bottom face and a sidewall portion extending therebetween; and a lateral thin film load transistor including a sidewall gate insulation region on said sidewall portion of said gate electrode between said top face and said bottom face and a lateral channel region on said sidewall gate insulation region between said top face and said bottom face such that said gate electrode controls the current in said lateral channel region between said top face and said bottom face, along a direction parallel to said substrate.

2. An SRAM according to claim 1 wherein said substrate has first conductivity type, wherein said spaced apart source/drain regions have second conductivity type, and wherein said lateral channel region has first conductivity type.

3. An SRAM according to claim 2 wherein said spaced apart source/drain regions comprise n-doped silicon, and wherein said lateral channel region comprises at least one of polycrystalline silicon and amorphous silicon.

4. An SRAM cell according to claim 1:

wherein a first one of the spaced apart source/drain regions of said substrate transistor comprises:

a lightly-doped inner portion disposed adjacent said gate electrode; and a heavily-doped outer portion disposed adjacent the lightly-outer portion, opposite said gate electrode; and wherein a second of the spaced apart source/drain regions comprises a lightly-doped source/drain region having an impurity concentration lower than said heavily-doped outer portion of said first source/drain region.

5. An SRAM cell according to claim 1 wherein said lateral channel region is electrically connected to one of said spaced-apart source/drain regions of said substrate transistor.

6. A static random access memory (SRAM) cell, comprising:

a substrate transistor including a gate insulation region on a substrate, spaced apart source/drain regions in said substrate, and a gate electrode on said gate insulation region, disposed between said spaced apart source/drain regions, said gate electrode having a top face, a bottom face and a sidewall portion extending therebetween; and a lateral thin film load transistor including a sidewall gate insulation region on said sidewall portion of said gate electrode, between said top face and said bottom face and a lateral channel region on said sidewall pate insulation region between said top face and said bottom face such that said gate electrode controls the current in said lateral channel region between said top face and said bottom face, along a direction parallel to said substrate;

wherein said lateral channel region has first and second surfaces and contacts said sidewall gate insulation region at said first surface, and further comprising:

an auxiliary gate including an auxiliary gate insulation region on said second surface of said lateral channel region and an auxiliary gate electrode on said auxiliary gate insulation region.

7. An SRAM cell according to claim 6 further comprising an insulation region on said substrate, and wherein said auxiliary gate electrode comprises an auxiliary gate electrode on said insulation region extending from said insulation region to overlie portions of said lateral channel region.

8. An SRAM cell according to claim 6 wherein said auxiliary gate electrode comprises at least one of doped polycrystalline silicon, silicide and metal.

9. A thin-film load transistor for a static random access memory (SRAM) cell including a driving transistor controlled by a controlling electrode on a substrate, the controlling electrode having a top face, a bottom face and a sidewall portion extending therebetween, the thin-film load transistor comprising:

a sidewall gate insulation region on the sidewall portion of the controlling electrode between said top face and said bottom face; and a lateral channel region on said sidewall gate insulation region between said top face and said bottom face such that the controlling electrode controls current in said lateral channel region between said top face and said bottom face, along a direction parallel to said substrate.

10. A thin-film load transistor for a static random access memory (SRAM) cell including a driving transistor controlled by a controlling electrode on a substrate, the controlling electrode having a top face, a bottom face and a sidewall portion extending therebetween, the thin-film load transistor comprising:

a sidewall gate insulation region on the sidewall portion of the controlling electrode between said top face and said bottom face; and a lateral channel region on said sidewall sate insulation region between said top face and said bottom face such that the controlling electrode controls current in said lateral channel region between said top face and said bottom face, along a direction parallel to said substrate;

wherein said lateral channel region has first and second surfaces and contacts said sidewall gate insulation region at said first surface, and further comprising:

an auxiliary gate including an auxiliary gate insulation region on said second surface of said lateral channel region and an auxiliary gate electrode on said auxiliary insulation region.

11. A load transistor according to claim 10 further comprising an insulation region on said substrate, and wherein said auxiliary gate electrode comprises an auxiliary gate electrode on said insulation region, extending from said insulation region to overlie portions of said lateral channel region.

* * * * *

UNITED STATES PATENT AND TRADEMARK OFFICE
CERTIFICATE OF CORRECTION

PATENT NO. : 5,866,921
DATED : February 2, 1999
INVENTOR(S) : Gyu-cheol Kim

It is certified that error appears in the above-identified patent and that said Letters Patent is hereby corrected as shown below:

On the title page and Column 1, line 1,

IN THE TITLE:
Delete the title and substitute "LATERAL SRAM TRANSISTOR CIRCUITS" therefor.

Column 8, line 13    Delete "sate" and substitute -- gate -- therefor.

Signed and Sealed this

Twenty-fifth Day of May, 1999

Attest:

Attesting Officer

Q. TODD DICKINSON

Acting Commissioner of Patents and Trademarks